June 18, 1968 A. J. PRETTY 3,388,464

CIRCUIT BOARD

Filed Dec. 9, 1965

ARTHUR J. PRETTY
INVENTOR.

BY Thomas W. Kennedy
ATTORNEY

United States Patent Office
3,388,464
Patented June 18, 1968

3,388,464

CIRCUIT BOARD

Arthur J. Pretty, Fayson Lakes, N.J., assignor to General Precision Systems Inc., a corporation of Delaware Filed Dec. 9, 1965, Ser. No. 512,718
1 Claim. (Cl. 29—627)

ABSTRACT OF THE DISCLOSURE

Method of making a circuit board by placing electrical components in component recesses of a mold bed with component leads extending upwards, pouring a first hardenable electrical insulation layer having thermal conduction material dispersed therethrough over said mold bed and between said components applying a layer of conductor strips over said first insulation layer between said components in a circuit pattern, pouring a second layer of insulating material over said conductive strips and said first layer and again applying conductor strips in a circuit pattern.

The present invention relates to a circuit board, and particularly to a molded circuit board and method of manufacture thereof.

A conventional circuit board comprises an electrical insulation sheet, which has a lower face and which has an upper face with a plurality of conductors bonded thereto and which has a plurality of passages extending between said upper and lower faces, and also comprises a plurality of components, which are disposed adjacent to said lower face and which have leads extending through said passages and selectively connecting to said conductors.

One problem with said conventional circuit board is that excessive vibratory displacements of the components and the leads relative to the insulation sheet cause lead failures.

In accordance with one embodiment of the present invention, vibratory displacements of the components and the leads relative to the insulation sheet are minimized by providing recess walls and passage walls in the insulation sheet and by bonding the components and the leads respectively thereto.

Accordingly, it is one object of the invention to minimize the probability of vibration failure of a circuit board.

It is another object of the invention to minimize the ratio of overall size and weight to overall strength and endurance of a circuit board.

It is a further object of the invention to provide an improved method of manufacture of a micro-electronic high-density circuit board.

To the fulfillment of these and other objects, the invention provides a one-piece circuit board comprising an electrical insulation sheet having an upper face with a plurality of conductors bonded thereto and having a lower face with a plurality of recesses with annular recess sidewalls and having a plurality of passages with annular passage walls extending between said upper and lower faces, and also comprising a plurality of components received in said recesses with outer surfaces bonded to said recess sidewalls and having respective leads extending through said passages and connecting to said conductors with outer lead surfaces bonded to said passage walls.

Other objects of the invention will become apparent upon reading the following description and the accompanying drawings, wherein like parts are designated by like numerals throughout the several views, and wherein.

Figure 3:
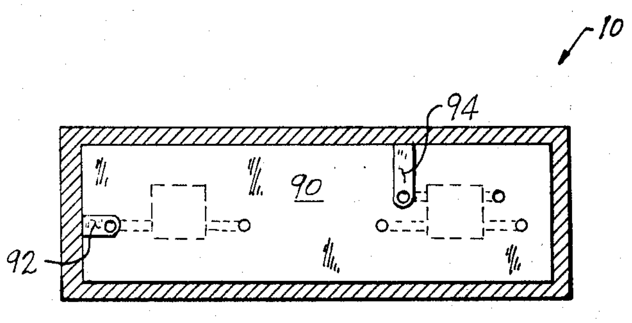
FIG. 3 is a sectional view taken along the line 3—3 of FIG. 1.
Figure 2:
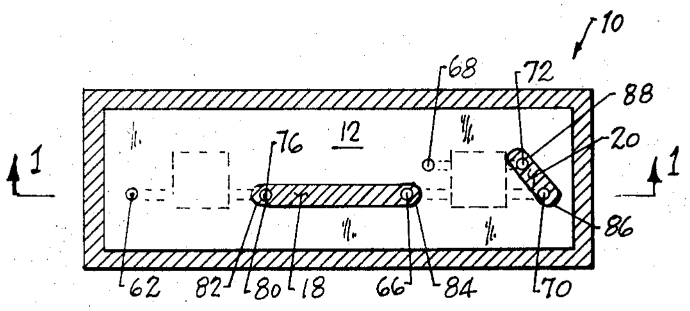
FIG. 2 is a sectional view taken along the line 2—2 of FIG. 1.
Figure 1:
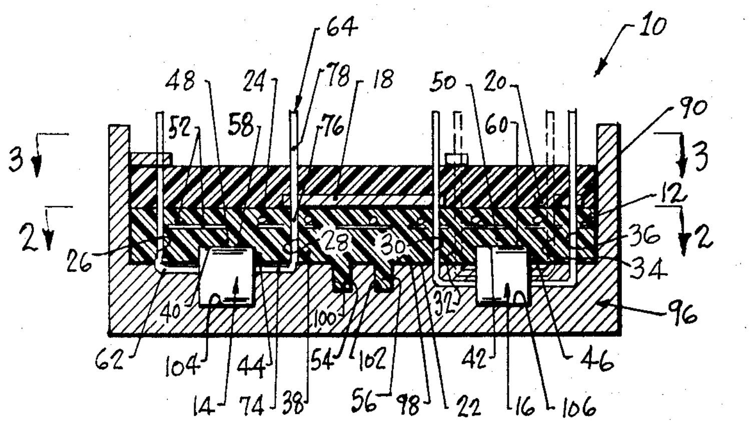
FIG. 1 is a sectional view of a circuit board embodying features of the present invention.

Referring to FIG. 1, one embodiment of the present invention is a high-density, component-interconnection, one-piece circuit board 10. Circuit board 10 comprises an insulation sheet 12, a plurality of components 14, 16, which are supported by and integral with sheet 12, and a plurality of conductor strips 18, 20 which are bonded to sheet 12 on the opposite side thereof.

Insulation sheet 12 has a lower face 22, which supports components 14, 16, and has an upper face 24, to which strips 18, 20 are bonded. Sheet 12 also has a plurality of similar passages 26, 28, 30, 32, 34, 36, which extend between faces 22 and 24, and which are similar in construction. Passage 28, which is typical of passages 26, 30, 32, 34, 36, has an annular sidewall 38. Lower face 22 has a plurality of recesses 40, 42, which receive respective components 14, 16, and which have respective annular walls 44, 46, and respective bottom walls 48, 50.

Insulation sheet 12 also has a plurality of criss-cross reinforcing rods or wires 52 for structural reinforcement thereof and to avoid bending and temperature cracks therein. Lower face 22 also has a plurality of structural ribs 54, 56 for additional reinforcement of sheet 12.

Components 14, 16 have respective outer surfaces 58, 60, which are bonded respectively to walls 44, 48 and 46, 50.

Component 14 has a pair of leads 62, 64, which extend therefrom from one end thereof, and which pass respectively through passages 26, 28 to upper face 24. Component 16 has two pairs of leads 66, 68 and 70, 72, which extend therefrom respectively from opposite ends thereof, and which pass through respective passages 30, 32 and 34, 36 to upper face 24. Lead 64, which is substantially identical in construction and shape to leads 62, 66, 68, 70, 72, is described hereafter in detail. Lead 64, which extends through passage 28, has a first portion 74, which projects transversely therefrom and which extends below lower face 22, and has a second portion 76, which extends between lower face 22 and upper face 24, and has a third portion 78, which projects upwardly from upper face 24. Portion 76 has an outer surface 80, which is bonded to passage sidewall 38.

Conductor strip 18 has opposite end portions 82, 84, which are fixedly connected to respective leads 64, 66; and strip 20 also has opposite end portions 86, 88, which are fixedly connected to respective leads 70, 72.

Board 10 preferably also has a second insulation sheet 90, which has a similar construction to sheet 12 and which is disposed over and bonded to upper face 24. Sheet 90 preferably also has a plurality of conductor strips 92, 94, which are similar in construction to strips 18, 20 and which are disposed over and bonded to sheet 90 for providing a multi-layer type of construction. Strips 92, 94 are preferably also used as terminals for board 10.

With this construction, components 14, 16 and sheets 12, 90 form an integral one-piece construction for minimizing vibratory and shock load failures. In addition, components 14 or 16 can be easily replaced by cutting leads 62, 64 or 66, 68, 70, 72 below lower face 22 and by resoldering new components thereto.

In the method of manufacture of circuit board 10, a mold fixture 96 with a substantially flat upper surface or bed 98 is used. Mold bed 98 has a plurality of elongated grooves 100, 102 for molding ribs 54, 56; and bed 98 has respective transversely-spaced component recesses 104, 106 for receiving components 14, 16.

In the method of manufacture of circuit board 10, the following steps in sequence are preferably followed:

(1) Position components 14, 16 in respective component recesses 104, 106.

(2) Position a first layer of reinforcement rods 52 slightly spaced above mold bed 98 in a criss-cross pattern with transverse spacing therebetween.

(3) Prepare a mixture of electrical insulation material, such as an epoxy, which has particles of thermal conduction material dispersed therethrough, such as metal filings.

(4) Pour a first hardenable layer of said mixture of electrical insulation material over mold bed 98 and against and around components surfaces 58, 60 and against and around leads 62, 64, 66, 68, 70, 72 to form an insulation sheet 12 upon hardening.

(5) Apply a first layer of plurality of conductor strips 18, 20 over said upper face 24 in a selective circuit pattern with said strip ends 82, 84, 86, 88 bearing against and around respective leads 64, 66, 70, 72, preferably by spraying strips 18, 20 thereon using a mask (not shown).

(6) Pour a second hardenable layer of said mixture of electrical insulation material over upper face 24 and against and around leads 62, 64, 66, 68, 70, 72 to form a second insulation sheet 90 upon hardening.

(7) Apply a second layer or plurality of conductor strips 92, 94 over sheet 90 in a selective pattern and in bearing against and around respective leads 62, 68.

In summary, this invention provides a high-density, component-interconnection, one-piece circuit board, in which the probability of vibration failure is minimized, in which the ratio of overall size and weight to overall strength and endurance is minimized, and which is made by an improved method of manufacture.

While the present invention has been described in a preferred embodiment, it will be obvious to those skilled in the art that various modifications can be made therein within the scope of the invention. It is intended that the appended claim cover all such modifications.

What is claimed is:

1. A method of making a one-piece circuit assembly by the sequential steps of:

positioning a plurality of transversely-spaced components in preformed component recesses of a mold bed with the component leads extending upwardly therefrom;

positioning a first layer, of reinforcement rods spaced slightly above the mold bed and over the components in a criss-cross pattern with transverse spacing therebetween allowing the leads to pass therebetween;

pouring a second layer, of hardenable electrical insulating material having particles of thermal conduction material dispersed therein over said mold bed and against and around the component surfaces and against and around a portion of the component leads while leaving the end portions of the said leads exposed and allowing said material to harden and form an insulation sheet;

forming a third layer, of conductive strips over the surface of said hardened insulation sheet in a selective circuit pattern with strip ends bearing against and around said leads by spraying said strip material through a mask over said second layer to form the desired pattern;

pouring a fourth layer over the said conductive strips while leaving certain of the lead ends exposed, said forth layer being of electrical insulation material similar to that used for said second layer to form a hardened insulation sheet upon hardening;

again forming a layer of conductor strips over said fourth layer in a selective pattern to engage and connect certain of the exposed leads, whereby a unitary structure of said components, insulation sheets and conductor strips is formed.

References Cited

UNITED STATES PATENTS

| | | | |
|---|---|---|---|
| 2,779,975 | 2/1957 | Lee et al. | 264—104 XR |
| 3,029,495 | 4/1962 | Doctor | 29—627 |
| 2,911,572 | 10/1959 | Francis et al. | 317—101 |
| 3,247,575 | 4/1966 | Parstorfer | 29—627 |

FOREIGN PATENTS 832,824 5/1960 Great Britain.

OTHER REFERENCES

Electronics—October 1956—Casting Resins—pg. 188, 189, 190, 191—copy in 264–272, grp. 150.

JOHN F. CAMPBELL, *Primary Examiner.*

R. W. CHURCH, *Assistant Examiner.*